US012805309B2

(12) United States Patent
Thompson et al.

(10) Patent No.: US 12,805,309 B2
(45) Date of Patent: Nov. 17, 2026

(54) ISOLATION TRANSFORMER PACKAGES WITH MAGNETOSTRICTION MANAGEMENT

(71) Applicant: Allegro MicroSystems, LLC, Manchester, NH (US)

(72) Inventors: Andrew Thompson, Cheshire (GB); Paul A. David, Bow, NH (US); Manoj Balakrishnan, Ingleby Barwick (GB)

(73) Assignee: Allegro MicroSystems, LLC, Manchester, NH (US)

( * ) Notice: Subject to any disclaimer, the term of this patent is extended or adjusted under 35 U.S.C. 154(b) by 346 days.

(21) Appl. No.: 18/594,168

(22) Filed: Mar. 4, 2024

(65) Prior Publication Data

US 2025/0279356 A1 Sep. 4, 2025

(51) Int. Cl.

*H10W 20/40* (2026.01)
*H01F 27/02* (2006.01)

(Continued)

(52) U.S. Cl.

CPC ........ *H10W 20/497* (2026.01); *H01F 27/022* (2013.01); *H01F 27/24* (2013.01);

(Continued)

(58) Field of Classification Search

CPC . H10W 20/497; H10W 74/114; H10W 76/12; H10W 76/17; H10W 90/00;

(Continued)

(56) References Cited

U.S. PATENT DOCUMENTS 4,461,966 A 7/1984 Hebenstreit
4,748,351 A 5/1988 Barzegar (Continued)

FOREIGN PATENT DOCUMENTS

DE 3700488 A1 7/1988
DE 10 2004 033 125 A1 2/2006

(Continued)

OTHER PUBLICATIONS

U.S. Appl. No. 18/192,932, filed Mar. 30, 2023, Horan et al.

(Continued)

*Primary Examiner* — William B Partridge
*Assistant Examiner* — Chevy J Boegel
(74) *Attorney, Agent, or Firm* — DALY, CROWLEY, MOFFORD & DURKEE, LLP

(57) ABSTRACT

Isolation transformer packages and structures and related methods reduce or minimize deleterious effects arising from magnetostriction during operation of the included transformer. An example transformer based integrated circuit package includes a substrate including a cavity, with the cavity including an aperture. A magnetic core is disposed in the cavity, with the magnetic core includes a soft ferromagnetic material. The cavity is configured to provide a space between an interior surface of the cavity and an exterior surface of the magnetic core. A cap is disposed in the aperture and configured to seal the aperture. A plurality of conductive traces forming first and second coils is disposed about the magnetic core, with the first and second coils and magnetic core forming a transformer.

39 Claims, 10 Drawing Sheets

(51) Int. Cl.
*H01F 27/24* (2006.01)
*H01F 27/28* (2006.01)
*H01F 41/04* (2006.01)
*H05K 1/18* (2026.01)
*H10W 74/10* (2026.01)
*H10W 76/12* (2026.01)
*H10W 76/17* (2026.01)
*H10W 90/00* (2026.01)

(52) U.S. Cl.
CPC ........... *H01F 27/28* (2013.01); *H01F 41/046* (2013.01); *H05K 1/18* (2013.01); *H10W 74/114* (2026.01); *H10W 76/12* (2026.01); *H10W 76/17* (2026.01); *H10W 90/00* (2026.01)

(58) Field of Classification Search
CPC .... H10W 44/501; H01F 27/022; H01F 27/24; H01F 27/28; H01F 27/2804; H01F 41/046; H05K 1/18
See application file for complete search history.

(56) References Cited

U.S. PATENT DOCUMENTS

| | | | | |
|---|---|---|---|---|
| 4,970,420 | A | 11/1990 | Billings | |
| 5,019,719 | A | 5/1991 | King | |
| 5,051,609 | A | 9/1991 | Smith | |
| 5,430,613 | A | 7/1995 | Hastings et al. | |
| 5,598,135 | A | 1/1997 | Maeda et al. | |
| 5,847,631 | A | 12/1998 | Taylor et al. | |
| 5,959,846 | A | 9/1999 | Noguchi et al. | |
| 6,107,860 | A | 8/2000 | Vinciarelli | |
| 6,181,130 | B1 | 1/2001 | Hoshi et al. | |
| 6,281,560 | B1 | 8/2001 | Allen et al. | |
| 6,377,155 | B1 | 4/2002 | Allen et al. | |
| 6,775,901 | B1 | 8/2004 | Lee et al. | |
| 6,791,851 | B2 | 9/2004 | Brkovic | |
| 7,023,315 | B2 | 4/2006 | Yeo et al. | |
| 7,119,448 | B1 | 10/2006 | de Stasi | |
| 7,173,835 | B1 | 2/2007 | Yang | |
| 7,663,351 | B2 | 2/2010 | Korsunsky | |
| 7,719,112 | B2 | 5/2010 | Shen | |
| 7,804,697 | B2 | 9/2010 | Melanson | |
| 7,868,431 | B2 | 1/2011 | Feng et al. | |
| 8,063,689 | B2 | 11/2011 | Theiler | |
| 8,094,458 | B2 | 1/2012 | Furnival | |
| 8,217,748 | B2 | 7/2012 | Feng et al. | |
| 8,680,837 | B2 | 3/2014 | Zeng et al. | |
| 8,736,343 | B2 | 5/2014 | Chen et al. | |
| 8,816,666 | B2 | 8/2014 | Kimura et al. | |
| 9,048,020 | B2 | 6/2015 | Calvillo Cortes et al. | |
| 9,660,584 | B2 | 5/2017 | Modi et al. | |
| 9,743,523 | B2 | 8/2017 | Huang et al. | |
| 9,847,166 | B2 | 12/2017 | Kneller | |
| 9,887,034 | B2 | 2/2018 | Francis | |
| 9,899,140 | B2 | 2/2018 | Kneller et al. | |
| 9,922,764 | B2 | 3/2018 | Kneller et al. | |
| 9,948,294 | B2 | 4/2018 | Peter et al. | |
| 10,002,703 | B2 | 6/2018 | Wang et al. | |
| 10,014,798 | B1 | 7/2018 | Vinciarelli | |
| 10,062,495 | B2 | 8/2018 | Lloyd | |
| 10,176,917 | B2 | 1/2019 | Parish et al. | |
| 10,217,558 | B2 | 2/2019 | Kneller | |
| 10,224,143 | B2 | 3/2019 | Kneller et al. | |
| 10,229,779 | B2 | 3/2019 | Harber | |
| 10,234,513 | B2 | 3/2019 | Vig et al. | |
| 10,256,027 | B2 | 4/2019 | Li et al. | |
| 10,319,509 | B2 | 6/2019 | Kneller et al. | |
| 10,347,413 | B2 | 7/2019 | Francis | |
| 10,573,457 | B2 | 2/2020 | Wang et al. | |
| 10,811,181 | B2 | 10/2020 | Parish et al. | |
| 10,930,422 | B2 | 2/2021 | Francis | |
| 11,139,102 | B2 | 10/2021 | Kneller et al. | |
| 11,201,619 | B2 | 12/2021 | Rinne et al. | |
| 11,211,929 | B2 | 12/2021 | Rinne et al. | |
| 11,282,631 | B2 | 3/2022 | Francis | |
| 11,764,778 | B2 | 9/2023 | Rinne et al. | |
| 2009/0147544 | A1 | 6/2009 | Melanson | |
| 2009/0237899 | A1 | 9/2009 | Furnival | |
| 2012/0008344 | A1 | 1/2012 | Zeng et al. | |
| 2012/0206171 | A1 | 8/2012 | Kimura et al. | |
| 2013/0056847 | A1* | 3/2013 | Chen | H01F 17/0013 257/E29.325 |
| 2013/0293268 | A1 | 11/2013 | Draxelmayr et al. | |
| 2016/0181004 | A1 | 6/2016 | Li et al. | |
| 2019/0305673 | A1* | 10/2019 | Yazaki | H01F 17/0013 |
| 2020/0035396 | A1* | 1/2020 | Weis | H01F 27/24 |
| 2020/0251274 | A1* | 8/2020 | Parish | H01F 27/2804 |
| 2021/0014972 | A1* | 1/2021 | Marin | H01F 17/0013 |
| 2021/0376822 | A1 | 12/2021 | Thompson et al. | |

FOREIGN PATENT DOCUMENTS

| | | | |
|---|---|---|---|
| GB | 2 250 383 | A | 6/1992 |
| GB | 2 341 288 | A | 3/2000 |
| JP | H01300617 | A | 12/1989 |
| JP | 2001 167941 | A | 6/2001 |
| JP | 2003 234234 | A | 8/2003 |
| JP | 2008 072021 | A | 3/2008 |
| WO | WO 93/21690 | | 10/1993 |
| WO | WO 95/12247 | | 5/1995 |
| WO | WO 2009/008739 | A1 | 1/2009 |
| WO | WO 2010/061281 | A2 | 6/2010 |
| WO | WO 2011/137845 | A1 | 11/2011 |
| WO | WO 2021/211920 | A1 | 10/2021 |

OTHER PUBLICATIONS

U.S. Appl. No. 18/297,034, filed Apr. 7, 2023, Torti.
U.S. Appl. No. 18/300,708, filed Apr. 14, 2023, Mangtani et al.
U.S. Appl. No. 18/300,711, filed Apr. 14, 2023, Taylor et al.
U.S. Appl. No. 18/302,998, filed Apr. 19, 2023, Salato et al.
U.S. Appl. No. 18/303,740, filed Apr. 20, 2023, Horan et al.
U.S. Appl. No. 18/307,921, filed Apr. 27, 2023, Salato et al.
U.S. Appl. No. 18/321,859, filed May 23, 2023, Horan et al.
U.S. Appl. No. 18/327,292, filed Jun. 1, 2023, Horan et al.
U.S. Appl. No. 18/338,479, filed Jun. 21, 2023, Taylor.
U.S. Appl. No. 18/340,053, filed Jun. 23, 2023, Salato et al.
U.S. Appl. No. 18/349,266, filed Jul. 10, 2023, Mangtani et al.
U.S. Appl. No. 18/350,049, filed Jul. 11, 2023, Taylor.
U.S. Appl. No. 18/456,666, filed Aug. 28, 2023, David et al.
U.S. Appl. No. 18/477,755, filed Sep. 29, 2023, Thompson.
U.S. Appl. No. 18/495,060, filed Oct. 26, 2023, Mangtani et al.
U.S. Appl. No. 18/519,254, filed Nov. 27, 2023, Chandra et al.
U.S. Appl. No. 18/524,130, filed Nov. 30, 2023, Chandra et al.
U.S. Appl. No. 18/524,132, filed Nov. 30, 2023, Chandra et al.
U.S. Appl. No. 18/533,527, filed Dec. 8, 2023, David et al.
U.S. Appl. No. 18/537,906, filed Dec. 13, 2023, Mangtani et al.
U.S. Appl. No. 18/538,520. filed Dec. 13, 2023, Chandra et al.
U.S. Appl. No. 18/417,582, filed Jan. 19, 2024, Taylor.
U.S. Appl. No. 18/430,841, filed Feb. 2, 2024, Thompson et al.
U.S. Appl. No. 18/438,831, filed Feb. 12, 2024, David et al.
U.S. Appl. No. 18/443,469, filed Feb. 16, 2024, David et al.
U.S. Appl. No. 18/594,168, filed Mar. 4, 2024, Thompson et al.
U.S. Appl. No. 18/606,252, filed Mar. 15, 2024, Mangtani et al.
U.S. Appl. No. 18/633,685, filed Apr. 12, 2024, Balakrishnan et al.
U.S. Appl. No. 18/779,495, filed Jul. 22, 2024, David et al.
U.S. Appl. No. 18/813,518, filed Aug. 23, 2024, Mangtani et al.
U.S. Appl. No. 18/818,749, filed Aug. 29, 2024, Latham et al.
Bourgeois, "An Isolated Gate 25 Drive for Power MOSFETs and IGBTs", STMicroelectronics Group, AN461/0194, 1999; 7 pages.
"ADuM4135 Data Sheet, Single-/Dual-Supply, High Voltage Isolated IGBT Gate Driver with Miller Clamp", Analog Devices Inc., Rev. E, 2015; 17 pages.

(56) References Cited

OTHER PUBLICATIONS

"Si827x", Datasheet Rev. 0.5, Silicon Laboratories Inc., 2016; 43 pages.

* cited by examiner (B)

ISOLATION TRANSFORMER PACKAGES WITH MAGNETOSTRICTION MANAGEMENT

BACKGROUND

Solid state switches typically include a transistor structure. The controlling electrode of the switch, usually referred to as its gate (or base), is typically controlled (driven) by a switch drive circuit, sometimes also referred to as gate drive circuit. Such solid state switches are typically voltage-controlled, turning on when the gate voltage exceeds a manufacturer-specific threshold voltage by a margin, and turning off when the gate voltage remains below the threshold voltage by a margin.

Switch drive circuits typically receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Some electronic systems, including ones with solid state switches, have employed galvanic isolation to prevent undesirable DC currents flowing from one side of an isolation barrier to the other. Such galvanic isolation can be used to separate circuits in order to protect users from coming into direct contact with hazardous voltages.

Various transmission techniques are available for signals to be sent across galvanic isolation barriers including optical, capacitive, and magnetic coupling techniques. Magnetic coupling typically relies on use of a transformer to magnetically couple circuits on the different sides of the transformer, typically referred to as the primary and secondary sides, while also providing galvanic separation of the circuits.

Transformers used for magnetic-coupling isolation barriers typically utilize a magnetic core to provide a magnetic path to channel flux created by the currents flowing in the primary and secondary sides of the transformer. Magnetic-coupling isolation barriers have been shown to have various drawbacks, including manufacturing problems, for integrated circuit (IC) packages due to the included magnetic core.

SUMMARY

Aspects of the present disclosure are directed to isolation transformer packages having magnetostriction management structures.

One general aspect of the present disclosure includes a transformer based integrated circuit (IC) package. The transformer based IC package may include a substrate including a cavity, where the cavity includes an aperture; a magnetic core disposed in the cavity, where the magnetic core includes a soft ferromagnetic material, where the cavity is configured to provide a space between an interior surface of the cavity and an exterior surface of the magnetic core; a cap disposed in the aperture and configured to seal the aperture; a plurality of conductive traces forming first and second coils disposed about the magnetic core, where the first and second coils and magnetic core are configured as a transformer; and an encapsulant material configured to encapsulate a surface of the substrate and/or magnetic core, where the molding material is configured to form a surface of a package body.

Implementations may include one or more of the following features. The space provided by the cavity may include a gap between the interior surface of the cavity and the exterior surface of the magnetic core. The gap may be between about 250 nm to about 2 mm. The IC package may include at least one semiconductor die disposed on the substrate. The at least one semiconductor die may include an integrated circuit (IC). The IC may include a gate driver. In some embodiments, the first and second coils can be configured as primary and secondary coils in a step-up configuration, step-down, or power transformer configuration. The magnetic core may include ferrite. The substrate may include a printed circuit board (PCB). The cap may include soft ferromagnetic material. The cap may include ferrite. The cap may include mold material. The cap may include a plurality of coil portions of the first and second coils. The substrate can include a step at the aperture, where the step is configured to receive the cap.

Another general aspect of the present disclosure includes a method of making an integrated circuit (IC) and transformer package. The method can include providing a substrate including a cavity, where the cavity includes an aperture; providing a magnetic core disposed in the cavity, where the magnetic core includes a soft ferromagnetic material, where the cavity is configured to provide a space between an interior surface of the cavity and an exterior surface of the magnetic core; providing a cap disposed in the aperture and configured to seal the aperture; providing first and second coils disposed about the magnetic core, where the first and second coils and magnetic core are configured as a transformer; and providing a molding material encapsulating a surface of the substrate, the cap, and the transformer, where the molding material forms a package body.

Implementations may include one or more of the following features. Providing the first and second coils disposed about the magnetic core may include connecting a first plurality of coil portions disposed in the substrate with a second plurality of coil portions disposed exterior to the substrate. The second plurality of coil portions can be provided after the cap is disposed in the aperture. The second plurality of coil portions may include wire bonds. The substrate may include a printed circuit board (PCB). The magnetic core and/or cap may include ferrite. The cap may include mold material. The cap may include a plurality of coil portions of the first and second coils. The substrate may include a step at the aperture, where the step is configured to receive the cap. The method may include providing one or more semiconductor die supported by the substrate. The one or more semiconductor die may include first and second semiconductor die, which may include first and second integrated circuits (ICs), respectively, and the first and second coils may be connected to the first and second ICs, respectively. The first and second ICs may be galvanically isolated. The second IC may include a gate driver.

Another general aspect of the present disclosure includes a voltage-isolated integrated circuit (IC) package. The voltage-isolated IC can include a package body including molding material; a substrate disposed within the package body, where the substrate includes a cavity having an aperture; a magnetic core disposed in the cavity, where the magnetic core includes a soft ferromagnetic material; where the cavity is configured to provide a space between an interior surface of the cavity and an exterior surface of the magnetic core, and where the magnetic core is unconstrained by the substrate; a cap disposed in the aperture and configured to seal the aperture; a plurality of conductive traces forming first and second coils disposed about the magnetic core, where the first and second coils and magnetic core are configured as a transformer; first and second IC die connected to the first and second coils, respectively; a first plurality of leads connected to the first IC die, where the first plurality of leads includes exposed lead portions accessible from the exterior of the package body; and a second plurality of leads connected to the second IC die, where the second plurality of leads includes exposed lead portions accessible from the exterior of the package body.

Implementations may include one or more of the following features. The second IC die of the IC package may include a gate driver. The transformer may be configured as a step-up transformer, a step-down transformer, or a power transformer. The magnetic core and/or cap can include ferrite. The substrate may include a printed circuit board (PCB). The space may include or define a gap between the interior surface of the cavity and the exterior surface of the magnetic core. The gap can be between about 100 nm to about 2 mm in some embodiments. The cap may include a mold material. The cap may include a plurality of coil portions of the first and second coils. The substrate may include a step at the aperture, where the step is configured to receive the cap. The IC package may include a seal disposed between the cap and the substrate. The seal may include epoxy.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, structures, circuits, and methods providing transformers and transformer structures that can be used for galvanic isolation (a.k.a., voltage isolation). Embodiments and examples can include leadframe-based packages with integrated IC-transformer structures having a core and coils in a transformer configuration and providing galvanic isolation for included IC die. In some embodiments, a transformer may have, e.g., a step up, a step down, or a power transformer configuration. Signals and/or power may be transferred from the primary side of the transformer to the secondary side.

One or more (e.g., first and second) semiconductor die having one or more integrated circuits (a.k.a., "IC die") can be included in the transformer packages. Such integrated circuits can include, e.g., but are not limited to, high-voltage circuits such as gate drivers configured to drive an external gate on a solid-state switch, e.g., a field effect transistor (FET), a metal oxide semiconductor FET (MOSFET), a metal semiconductor FET (MESFET), a gallium nitride FET (GaN FET), a high electron mobility transistor (HEMT), a silicon carbide FET (SIC FET), an insulated gate bipolar transistor (IGBT), or another load. The included transformer structure provides galvanic separation between the primary and secondary transformers sides, including any connected ICs.

Figure 1:
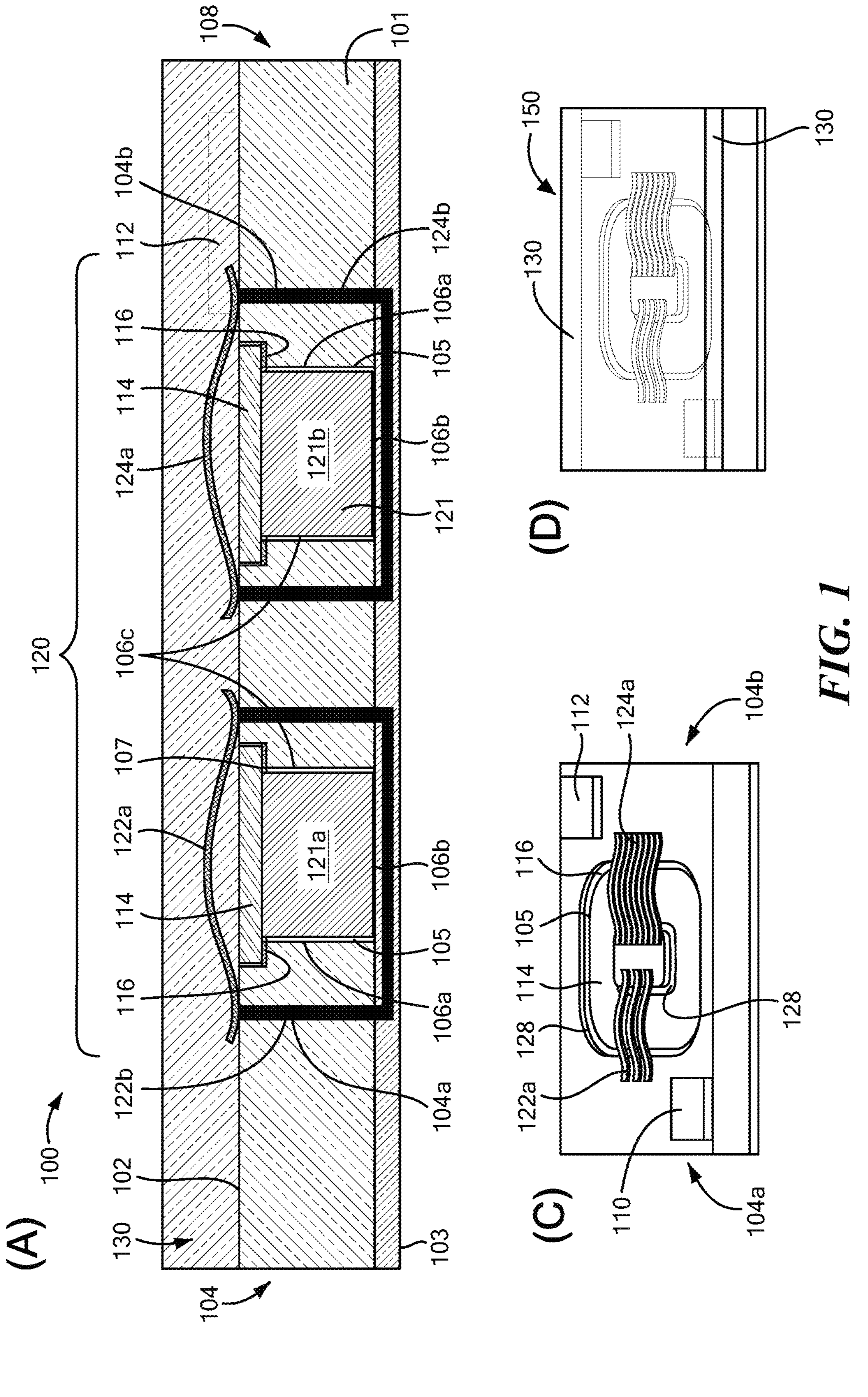
FIG. 1 includes views (A)-(D) showing side cross sectional, exploded, partially assembled, and assembled views of an example isolation transformer package with magnetostriction management structure, respectively, in accordance with the present disclosure.
Figure 1:
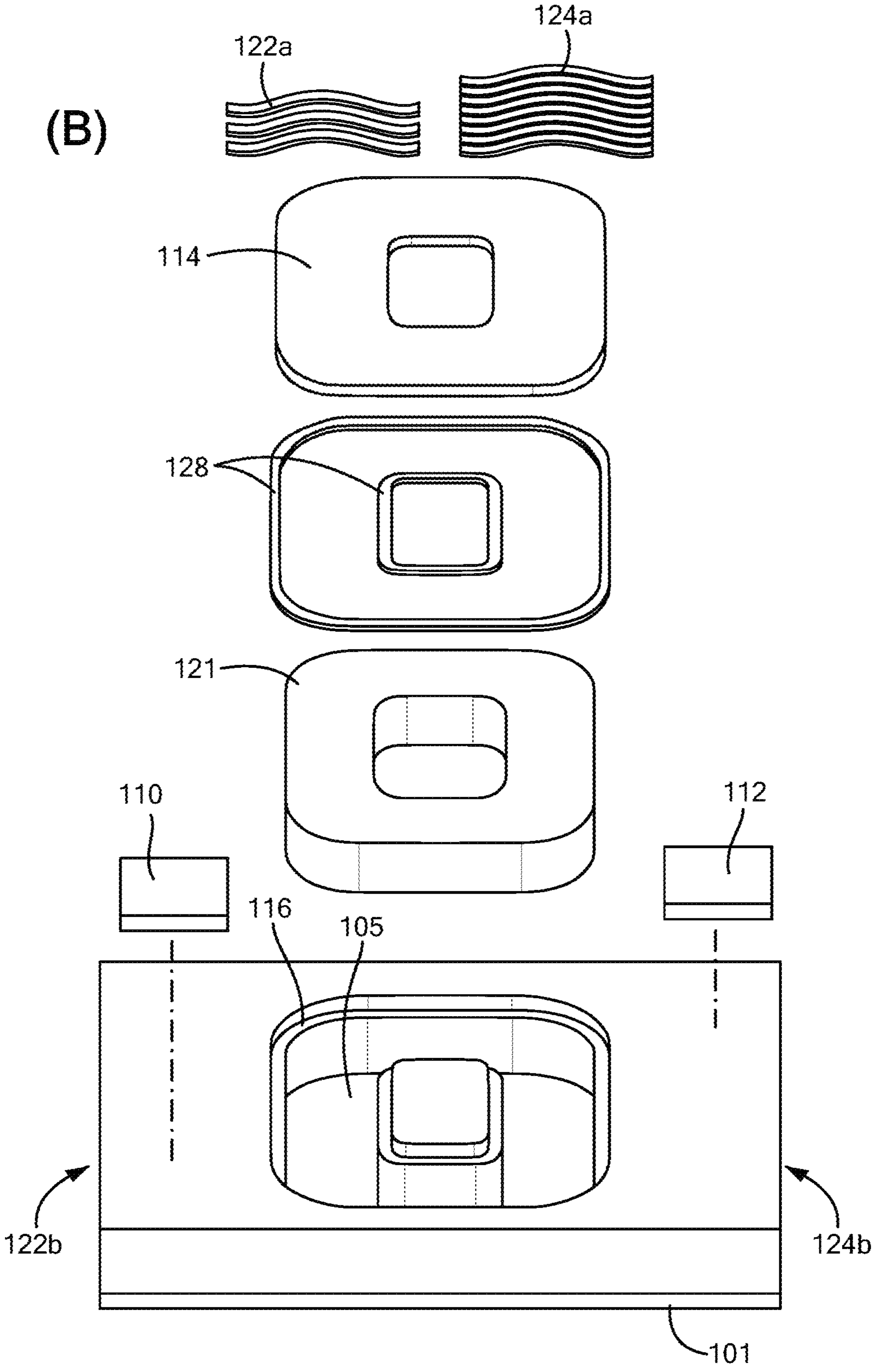

FIG. 1 includes views (A)-(D) showing side cross sectional, exploded, partially assembled, and assembled views of an example isolation transformer package 100 with magnetostriction management structure, respectively, in accordance with the present disclosure.

View (A) shows package 100 including a substrate 101 with opposed first and second surfaces (sides) 102, 103. Substrate 101 can include a laminated structure in some embodiments. Substrate 101 can include a plurality of conductive structures or traces 104, which may be on a surface of substrate, e.g., surface 102, and/or included in the interior of substrate 101. The plurality of conductive traces 104 can include a first group **104*a* and a second group 104*b* that are galvanically separate from one another. The first group 104*a* can include a plurality of exposed portions (not shown) that are exposed at a first area (or areas) of the substrate 101, e.g., solder contacts or pads on surface 103, and the second group can include a plurality of exposed portions (not shown) that are exposed at a second area (or areas) of the substrate 101, e.g., solder contacts (pads) on surface 103; the exposed portions can be used for input/output (I/O) functionality for package 100**.

Package 100 also includes transformer 120 having magnetic core 121, and primary coil 122 and secondary coil 124, which are configured about transformer core 121 and galvanically separated. Primary coil 122 and secondary coil 124 can each include multiple portions. For example, coils 122 and 124 can include portions exterior to substrate 101 and other portions interior to (e.g., formed or embedded in) substrate 101, as shown by coils portions 122*a* and 124*a* and 122*b* and 124*b*, respectively. The first and second groups of traces 104*a-b* can be connected to galvanically separated primary and secondary sides of transformer 120, respectively, as explained in further detail below. Substrate 101 includes a recess (a.k.a., cavity or aperture) 105 defined by walls (surfaces) 106*a-c* for placement of magnetic core 121. Recess/cavity 105 can form or present an aperture 107 at substrate surface 102 and/or at a surface presented by stepped surface (a.k.a., step) 116. Recess/cavity 105 can provide a space or gap about core 121, which can accommodate magnetostriction effects, including changes in size, on core arising from operation of transformer 120. In some embodiments, the space or gap may be between about 250 nm to about 2 mm (inclusive of any subrange).

A protective cap 114 may be present to facilitate sealing of core 121 within recess 105. Cap 114 can function to prevent material ingress into recess 105, e.g., during one or more molding (overmolding) steps applying molding to/on surface 102 or during operation/use of package 100. In some embodiments, an optional step 116 may be present in a surface of substrate 101, e.g., side wall 106*a*, to receive or support a portion of cap 114 or core 121 (see 507*a* in FIG. 5A). Any suitable material may be used for cap 114. In some examples, cap 114 may include a molding material. In some embodiments, cap 114 may include ferrite.

In some embodiments, substrate 101 can include a printed circuit board (PCB), e.g., a PCB including FR4, FR5, or other PCB material(s). In some embodiments, substrate 101 can include one or more layers of low-temperature cofired ceramic (LTCC) or high-temperature cofired ceramic (HTCC). In some embodiments, substrate 101 can include an alumina substrate or a glass substrate comprising one or more layers of metal and insulation.

Transformer core 121—shown with cross-sections 121*a-b*—can include one or more soft (referring to magnetic property) ferromagnetic materials. In some embodiments, core 121 can include ferrite, iron particles, ferrosilicon, nickel, nickel alloys (e.g., iron nickel), and/or the like. In some embodiments, core 121 can include a sintered soft ferromagnetic material. Primary coil 122 and secondary coil 124 can each have a desired number of windings, which may differ from coil to coil. Portions of primary and secondary coils 122 and 124, i.e., coil portion 122*a* and 124*a*, are shown configured (wound) about core 121 as insulated wire or wire bonds, with ends connected to other coil portions, i.e., coil portions 122*b* and 124*b*, of primary and secondary coils 122 and 124 within or on substrate 101, completing the windings of each coil 122, 124 about core 121. Insulating material (not shown) may be disposed between core 121 and substrate 101. Coils 122 and 124 can be connected, e.g., by way of conductive traces 104, to respective sets of connection structures, e.g., solder contacts or pads (not shown).

View (B) shows an exploded perspective view of package 100. IC die 110 and 112 are shown. In some embodiments, IC die 110 and/or 112 can include quad flat no-lead (QFN) packages. Wire portions of primary coil 122*a* and secondary coil 124*a* are shown. Any suitable conductive material(s) may be used for coils 122 and 124. In some examples, copper or aluminum may be used for wire portions 122*a* and/or 124*a*. Embedded (buried) coil portions 122*b* and 124*b* of primary and secondary coils 122 and 124 are also indicated. In some examples, copper may be used for embedded coil portions 122*b* and/or 124*b*. Secondary coil 124 is shown having a greater number of coil windings than primary coil 122 as would be the case in a step up transformer configuration. The coils 122 and 124 may have different numbers of coil windings in other embodiments. First and second galvanically separated groups of conductive structures/traces 104*a* and 104*b* (which may be internal to substrate 101 and/or on one or more surfaces of substrate 101) are also indicated and may be made of any suitable conductive material(s), e.g., copper (as a non-limiting example). Optional sealing structure (e.g., silicone sealant/gel and/or epoxy) 128 is indicated.

View (C) shows an assembled perspective view of package 100. The transformer configuration of primary and secondary coils 122, 124 and core 121 and galvanic separation of connecting conductive structures/traces 104*a-b* provide galvanic separation of IC 110 and 112 while allowing transfer of power and/or signals between primary and secondary sides of the transformer (e.g., between IC 110 and IC 112). In some embodiments, primary and secondary coils 122, 124 may be configured in a step up transformer configuration with secondary coil 124 being on the higher-voltage side. In some embodiments, IC 112 may include a gate driver, e.g., configured to control a semiconductor power switch.

View (D) shows structure of view (C) with an added layer of encapsulant 130 forming package structure 150. Encapsulant 130 may be added by one or more application steps, e.g., compression molding. Any suitable material may be used for encapsulant 130. Examples may include, but are not limited to, one or more molding materials, potting materials, dielectric materials, or the like.

Figure 2:
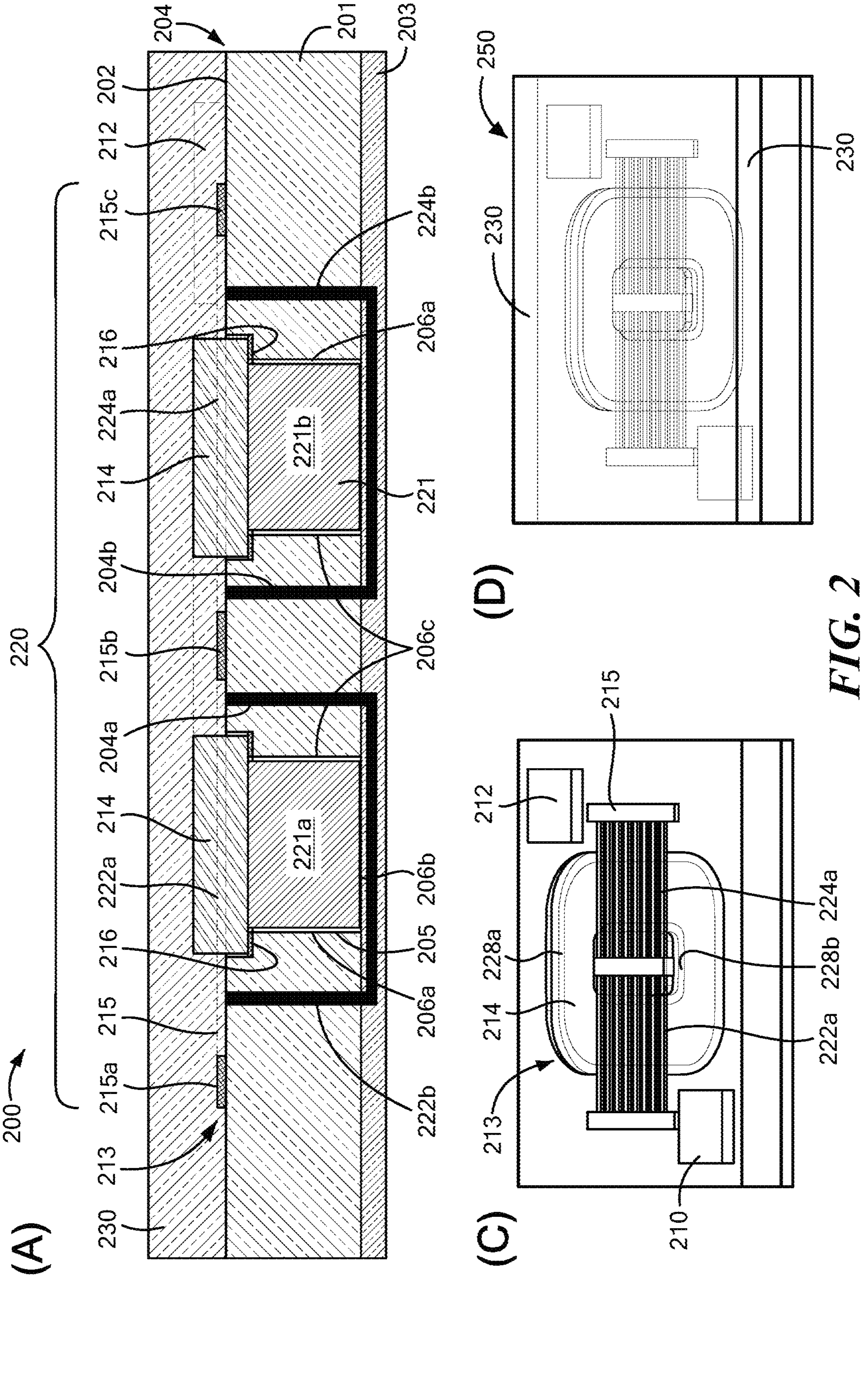
FIG. 2 includes views (A)-(D) showing side cross sectional, exploded, partially assembled, and assembled views of an example isolation transformer package including a clip assembly forming coil portions, respectively, in accordance with the present disclosure.
Figure 2:
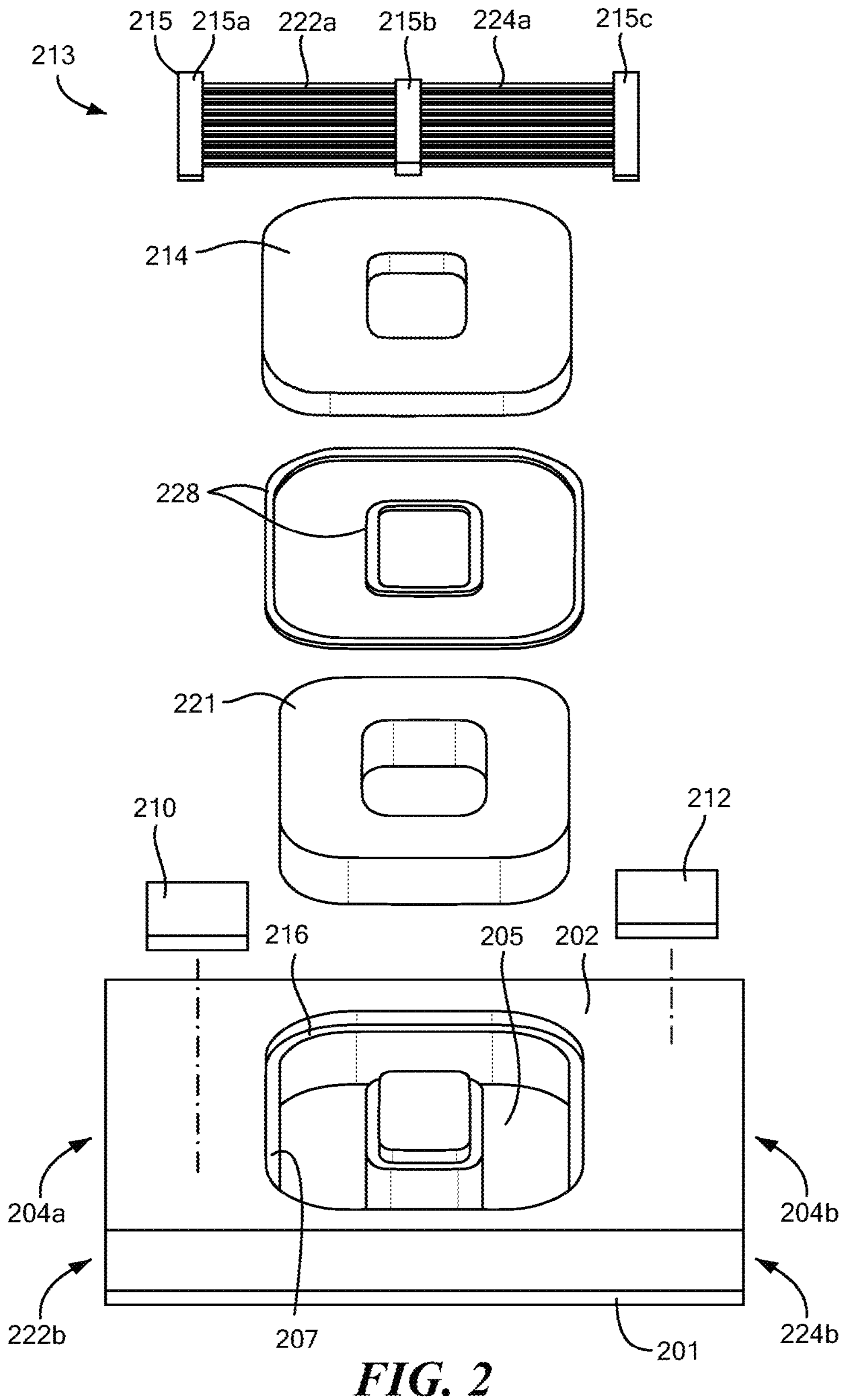

FIG. 2 includes views (A)-(D) showing side cross sectional, exploded, partially assembled, and assembled views of an example isolation transformer package 200 including a clip assembly forming coil portions, respectively, in accordance with the present disclosure. Package 200 includes magnetostriction managements structures similar to package 100 of FIG. 1 while also including the clip assembly that forms portions of primary and secondary transformer coils.

View (A) shows package 200 including a substrate 201 with opposed first and second surfaces (sides) 202, 203. Substrate 201 can include a laminated structure in some embodiments. Substrate 201 can include a plurality of conductive structures or traces 204, which may be on a surface of substrate, e.g., surface 202, and/or included in the interior of substrate 201. The plurality of conductive traces 204 can include a first group 204*a* and a second group 204*b* that are galvanically separate from one another. The first group 204*a* can include a plurality of exposed portions (not shown) that are exposed at a first area (or areas) of the substrate 201, e.g., solder contacts or pads on surface 203, and the second group can include a plurality of exposed portions (not shown) that are exposed at a second area (or areas) of the substrate 201, e.g., solder contacts (pads) on surface 203; the exposed portions can be used for input/output (I/O) functionality for package 200.

Package 200 also includes transformer 220 with magnetic core 221, primary coil 222 and secondary coil 224 configured about transformer core 221 and galvanically separated. Primary coil 222 and secondary coil 224 can each include multiple portions. For example, coils 222 and 224 can include portions exterior to substrate 201 and other portions interior to substrate 201, as shown by coils portions 222*a* and 224*a* and 222*b* and 224*b*, respectively. The first and second groups of traces 204*a-b* can be connected to galvanically separated primary and secondary sides of transformer 220, respectively, as explained in further detail below. Substrate 201 includes a recess or cavity 205 defined by walls 206*a-c* for placement of magnetic core 221. Recess/cavity 205 can form or present an aperture 207 at surface 202 and/or at a surface defined by step 216.

View A also shows assembly (clip) 213 that includes portions of the primary and secondary coils (portions 222*a* and 224*a*), protective cap 214, and frame 215, having frame elements 215*a-c*. Protective cap 214 may facilitate sealing of core 221 within recess 205, and can function to prevent material ingress into recess 205, e.g., during one or more molding steps (e.g., an overmolding step) applying molding material(s) to/on surface 202. In some embodiments, an optional step 216 may be present in a surface of substrate 201, e.g., side wall 206*a*, to receive or support a portion of cap 214 or core 221 (see 507*a* in FIG. 5A). Coil portions 222*a* and 224*a* can be held by frame elements 215*a-c*. In some embodiments frame elements 215*a-c* can include or be made from insulative material(s) to facilitate/provide galvanic separation of coils 222 and 224. Assembly (clip) 213 can be used to simplify, reduce cost, and/or reduce required time for fabrication of structure 200.

In some embodiments, substrate 201 can include a printed circuit board (PCB), e.g., a PCB including FR4, FR5, or other PCB material(s). In some embodiments, substrate 201 can include one or more layers of low-temperature cofired ceramic (LTCC) or high-temperature cofired ceramic (HTCC). In some embodiments, substrate 201 can include an alumina substrate or a glass substrate comprising one or more layers of metal and insulation.

Transformer core 221—shown with cross-sections 221*a-b*—can include one or more soft (referring to magnetic property) ferromagnetic materials. In some embodiments, core 221 can include ferrite, iron particles, ferrosilicon, nickel, nickel alloys (e.g., iron nickel), and/or the like. In some embodiments, core 221 can include a sintered soft ferromagnetic material. Primary coil 222 and secondary coil 224 can each have a desired number of windings, which may differ from coil to coil. Portions of primary and secondary coils 222 and 224, i.e., coil portion 222*a* and 224*a*, are shown configured (wound) about core 221 as insulated wire or wire bonds, with ends connected to other coil portions, i.e., coil portions 222*b* and 224*b*, of primary and secondary coils 222 and 224 within or on substrate 201, completing the windings of each coil 222, 224 about core 221. Insulating material (not shown) may be disposed between core 221 and substrate 201. Coils 222 and 224 can be connected, e.g., by way of conductive traces 204, to respective sets of connection structures, e.g., solder contacts or pads (not shown).

View (B) shows an exploded perspective view of package 200. IC die 210 and 212 are shown. In some embodiments, IC die 210 and/or 212 can include quad flat no-lead (QFN) packages. Wire portions of primary coil 222*a* and secondary coil 224*a* are shown. Embedded coils portions 222*b* and 224*b* of primary and secondary coils 222 and 224 are indicated. Secondary coil 224 is shown having a greater number of coil windings than primary coil 222 as would be the case in a step up transformer configuration. The coils may have different numbers of coil windings in other embodiments. First and second galvanically separated groups of conductive structures/traces 204*a* and 204*b* (which may be internal to substrate 201 and/or on one or more surfaces of substrate 201) are also indicated. Assembly (clip) 213, with coil portions 222*a* and 224*a*, is shown with protective cap 214 and frame 215 (with frame elements 215*a-c*). Optional sealing structure (e.g., silicone sealant/gel and/or epoxy) 228 is indicated.

View (C) shows an assembled perspective view of package 200. The transformer configuration of primary and secondary coils 222, 224 and core 221 and galvanic separation of connecting conductive structures/traces 204*a-b* provide galvanic separation of IC 210 and 212 while allowing transfer of power and/or signals between primary and secondary sides of the transformer (e.g., between IC 210 and IC 212). In some embodiments, primary and secondary coils 222, 224 may be configured in a step up transformer configuration with secondary coil 224 being on the higher-voltage side.

View (D) shows structure of view (C) with an added layer of encapsulant 230 forming package structure 250. Encapsulant 230 may be added by one or more application steps, e.g., compression molding. Any suitable material may be used for encapsulant 230. Examples may include, but are not limited to, one or more molding materials, potting materials, dielectric materials, or the like.

Some examples and embodiments of the present disclosure can include magnetic cores that are not necessarily configured entirely in a recess in the substrate and generally parallel to the substrate. Some examples and embodiments can include cores having portions (such as legs or plates or other similar structures) that pass through one or more apertures in a substrate, e.g., so-called C-cores or E-cores.

Figure 3:
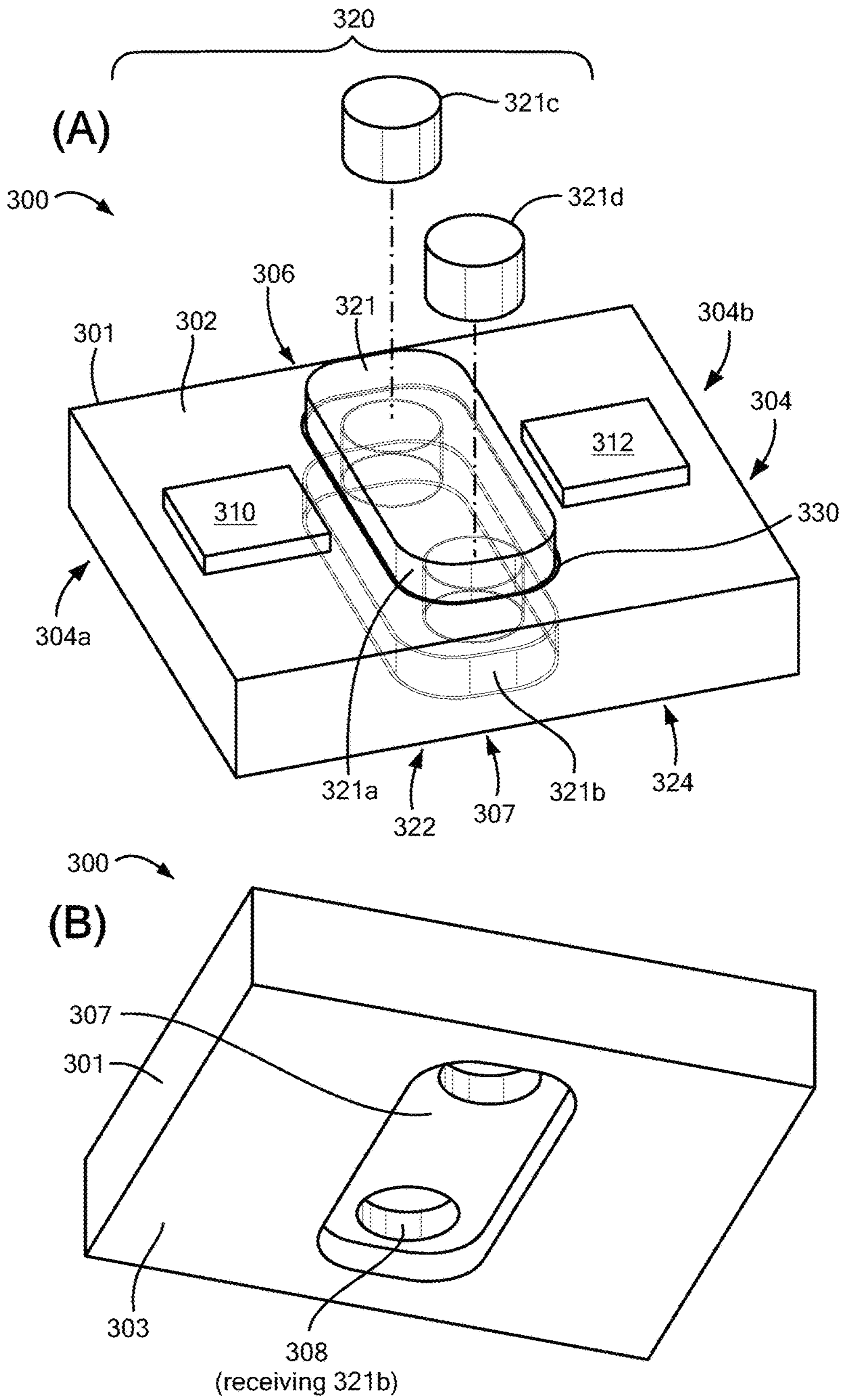
FIG. 3 includes views (A)-(D) showing views of an isolation transformer package a C-core and magnetostriction management structure, in accordance with another embodiment of the present disclosure.
Figure 3:
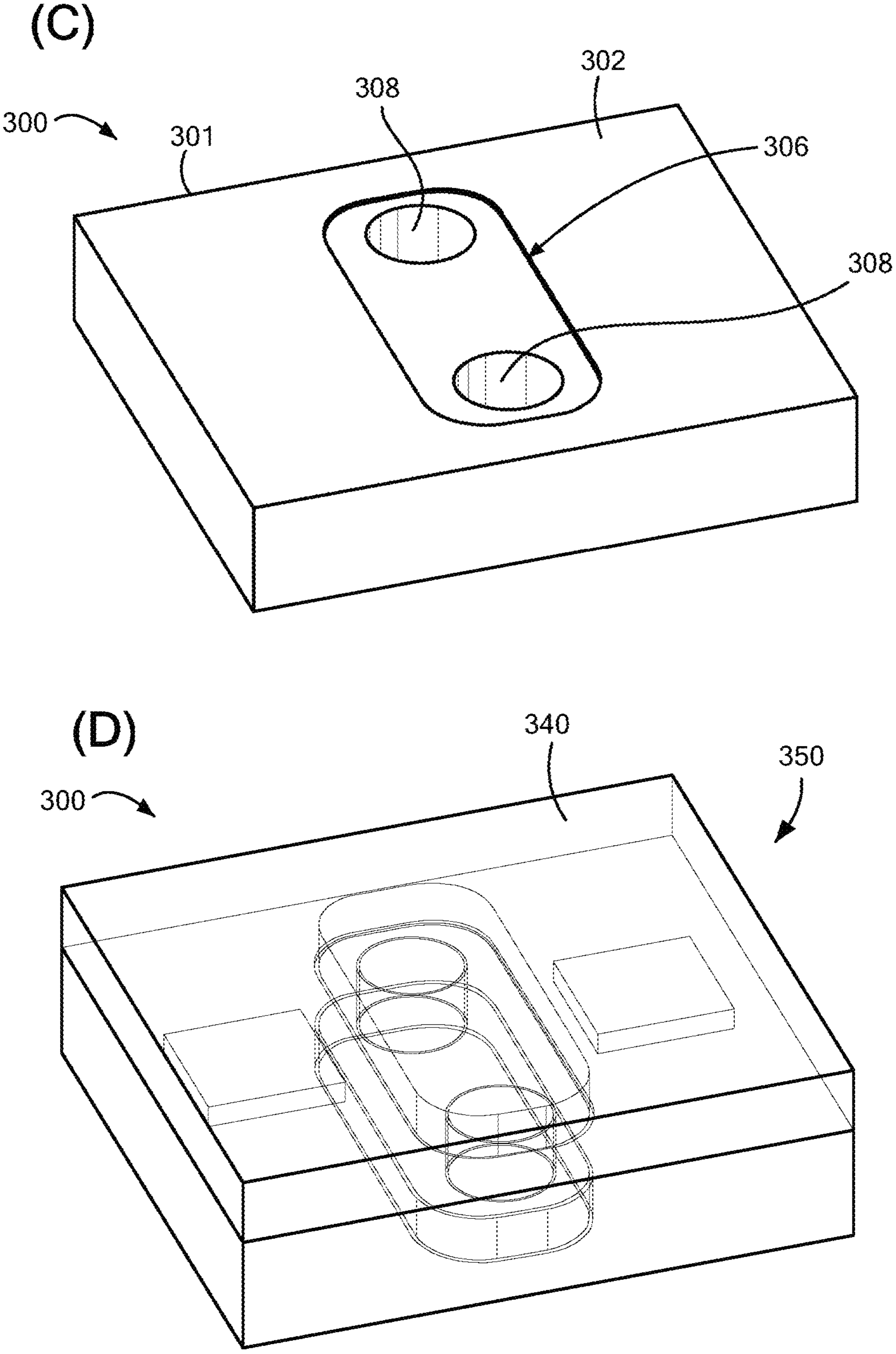

FIG. 3 includes views (A)-(D) showing views of an isolation transformer package 300 with a C-core and magnetostriction management structure, in accordance with another embodiment of the present disclosure. As shown, package 300 includes a so-called C-core as a magnetic core for the included transformer.

As shown in view (A), package 300 includes substrate 301 having opposed first and second surfaces (sides) 302, 303. Substrate 301 can include conductive structures and/or traces 304 interior to substrate 301 and/or disposed on one or more surfaces 302, 303 for connections to package components and/or as I/O structures. Conductive structures 304 can include first and second groups 304*a*, 304*b* that are galvanically separated. Primary die 310 and secondary die 312 are shown disposed on surface 302. In some embodiments, IC die 310 and/or 312 can include quad flat no-lead (QFN) packages. Transformer 320 includes magnetic core 321 and primary and secondary coils 322 and 324. Coils 322 and 324 may be entirely embedded or disposed within substrate 301. Substrate 301 can include one or more recesses (e.g., recesses 306, 307) on surfaces 302 and/or 303 to receive core 321. The transformer configuration of primary and secondary coils 322, 324 and core 321 can provide galvanic separation of IC 310 and 312 while allowing transfer of power and/or signals between primary and secondary sides of the transformer (e.g., between IC 310 and IC 312). In some embodiments, primary and secondary coils 322, 324 may be configured in a step up transformer configuration with secondary coil 324 being on the higher-voltage side.

Magnetic core 321 can include any suitable soft ferromagnetic material(s) and may be configured as a C-core with multiple portions that can be connected together for operation of transformer 320. For example, three core portions 321*b-d* may formed/connected together and core portion 321*a* may be coupled to those joined/integral portions after they have been positioned for use relative to substrate 301.

As shown in view (B), substrate 301 can include recess 307 in surface 303. Recess 307 can be configured to receive a portion of core 321, e.g., a bottom plate of core 321. In some embodiments, recess 307 can have a shape that matches that of the received portion of core 321. Substrate 301 can also include one or more apertures 308 that are configured to receive one or more portions of core 321, e.g., cylindrical core portions (a.k.a., legs or arms) 321*c-d*. Apertures 308 can pass from surface 302 to 303.

As shown in view (C), substrate 301 can include recess 306 in surface 302, with recess 306 being configured to receive a portion of core 321 e.g., a top plate of core 321. In some embodiments, recess 307 can have a shape that matches that of the received portion of core 321. In some embodiments, a seal structure or material (sealant) may be applied between the received portion(s) of core 321 and substrate 301 to facilitate prevention of material ingress to recesses 306, 307 and/or apertures 308 during fabrication, e.g., an overmolding step, and/or during operation of transformer 320.

As shown in view (D), an encapsulant material 330 can be applied to substrate 301, e.g., to surface 302. Any suitable material(s) may be used for encapsulant 330. Examples may include, but are not limited to, molding materials, potting materials, dielectric materials, etc. Encapsulant 330 may define one or more surfaces of a package structure or body 350.

Figure 4:
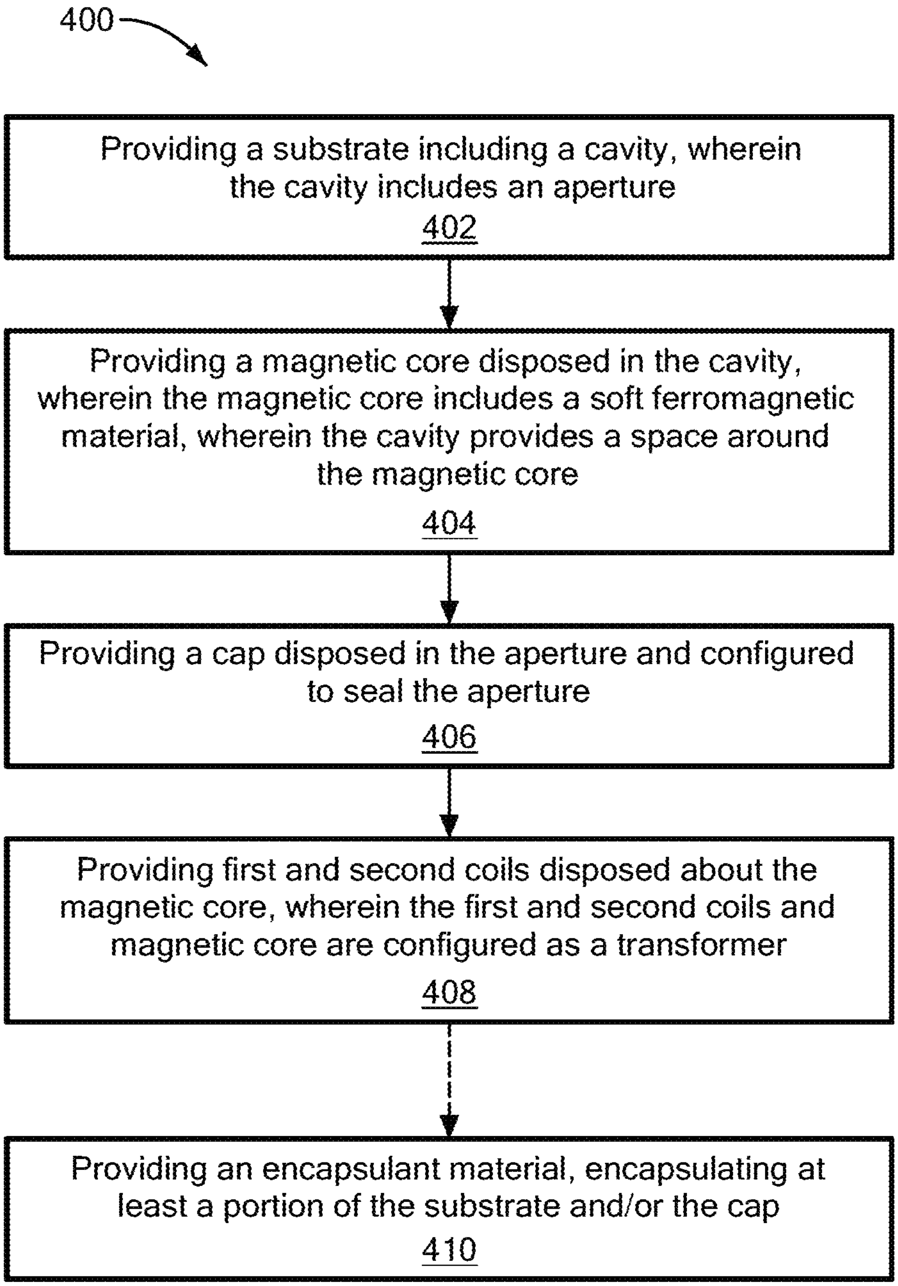
FIG. 4 is a diagram showing an example method of fabricating an isolation transformer package with magnetostriction management structure, in accordance with the present disclosure.

FIG. 4 is a diagram showing an example method of fabricating an isolation transformer package with magnetostriction management structure, in accordance with the present disclosure. Method 400 can include providing a substrate including a cavity or recess, with the cavity including one or more apertures, as described at 402. A magnetic core can be provided that is disposed in the cavity or recess, with the magnetic core including one or more soft ferromagnetic materials, and with the cavity providing a space (gap) around the magnetic core, as described at 404. Method 400 can include providing a cap covering the recess and/or disposed in the aperture(s) and configured to seal the aperture(s), as described at 406. In some embodiments, the cap can include a portions of the magnetic core, e.g., when the magnetic core is configured as a C-core.

First and second coils can be provided that are disposed about the magnetic core, with the first and second coils and magnetic core being configured as a transformer, as described at 408. Method 400 can optionally include providing an encapsulant (encapsulate) material, encapsulating at least a portion of the substrate and/or the cap. The encapsulant material can define one or more surfaces of a package body. In some embodiments, the encapsulant can include a molding material, a potting material, and/or a dielectric material.

Figure 5A:
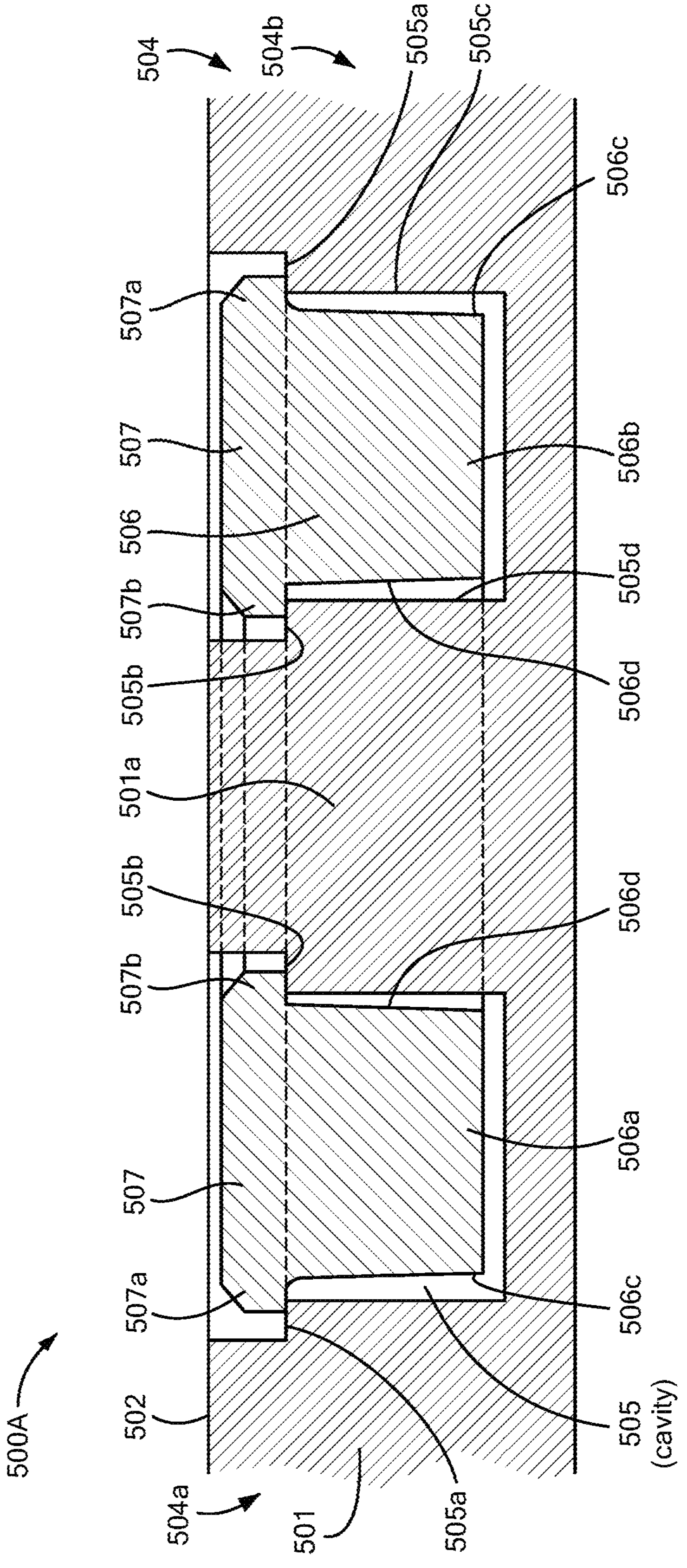
FIGS. 5A-5B show side cross section views of example core and substrate cavity configurations, in accordance with the present disclosure.
Figure 5B:
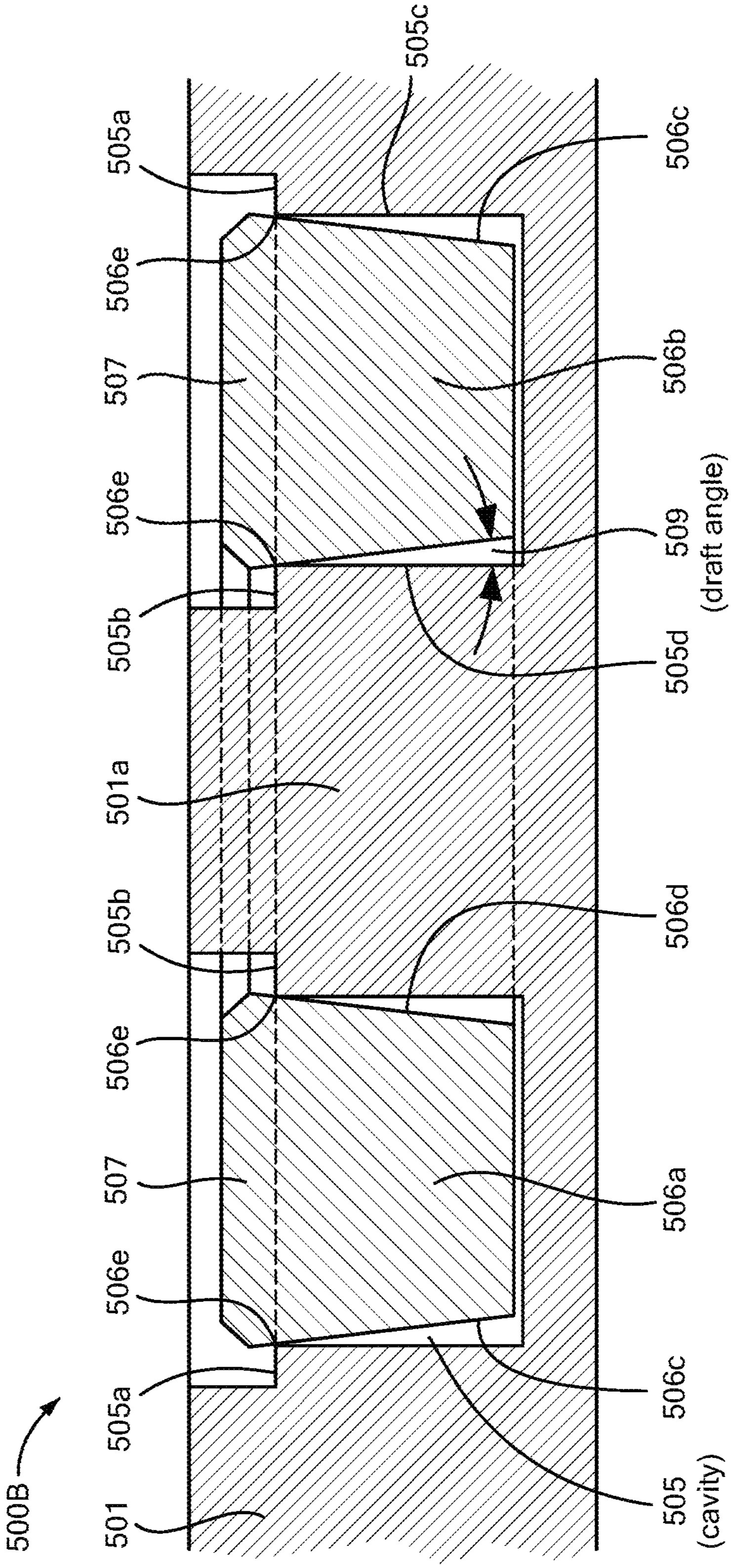

FIGS. 5A-5B show side cross section views of example core and substrate cavity configurations 500A, 500B, in accordance with the present disclosure.

FIG. 5A shows substrate 501 having first and second opposed surfaces (sides) 502, 503. Substrate 501 can include a plurality of conductive structures or traces 504, which may be interior to the substrate 501 and/or disposed on one or more surfaces of substrate 501, e.g., surface 502, surface 503. Conductive structures/traces 504 can include first and second groups 504*a-b* that are galvanically separated. Conductive structures/traces 504 can connect components mounted to or included in substrate 501 and/or form I/O structures. Substrate 501 can include a recess or cavity 505, which may receive magnetic core 506. Cavity 505 can include an outer step 505*a*, an inner step 505*b*, outer sidewall 505*c*, and inner sidewall 505*d*, as shown. Core 506 may include one or more soft ferromagnetic materials (e.g., ferrite) and may have a closed shape, as indicated by cross sections 506*a-b*, each shown with sidewalls 506*c-d*. A portion of substrate 501, i.e., portion 501*a*, e.g., an interior portion or central island, is shown surrounded by recess 505. Recess/cavity 505 can provide a space or gap about core 506; the space or gap provided by cavity 505 can accommodate magnetostriction effects, including changes in size, on core 506 arising from operation of transformer 120. In some embodiments, the space or gap may be between about 250 nm to about 2 mm (inclusive of any subrange). The space or gap is not necessarily uniform about core 506 and in some embodiments (see FIG. 5B), the gap (space) may vary.

As shown, core 506 may have a T-shaped cross section that includes a wider portion 507 that has overhangs or lips—shown as lip/overhang 507*a* and lip/overhang 507*b*—which can be supported by steps 505*a* and 505*b*, respectively, when core 506 is disposed in recess/cavity 505. This configuration of core 506, with portion 507, can enable the core (e.g., ferrite) to create a seal (e.g., at points 506*e*) even after accommodating the manufacturing tolerances of the core and substrate 501 (e.g., PCB).

FIG. 5B shows substrate 501 (similar to as shown in FIG. 5A) receiving core 506, which has a tapered or wedge-shaped cross section (shown by 506*a-b*). Core 506 may have a closed shape, e.g., one that is oval or rectangular, and is disposed in cavity/recess 505 having stepped surfaces 505*a-b* and sidewalls 505*c-d*. Stepped surfaces 505*a-b* are optional and may be omitted in some embodiments.

As shown, core 506 has sidewalls 506*c-d* that are non-parallel relative to cavity sidewalls 505*c-d*, respectively. The core sidewalls 506*c-d* and the cavity sidewalls 505*c-d* can accordingly form an angle (a.k.a., a draft angle), shown as 509. The degree of magnitude of the draft angle 509 may be implemented as desired. A seal, between the core 506 and the substrate at the perimeters of the cavity, can be created with the draft angle on the mating edges of a core 506, as shown. Sealing the recess/cavity 505 with a wedge shape provided by the core 506 may, in some situations, result in the core (e.g., at cross sections shown) sitting at different heights within the recess/cavity, e.g., due to cores and/or recesses being manufactured with manufacturing variations, even though they may be within design tolerances.

Figure 6:
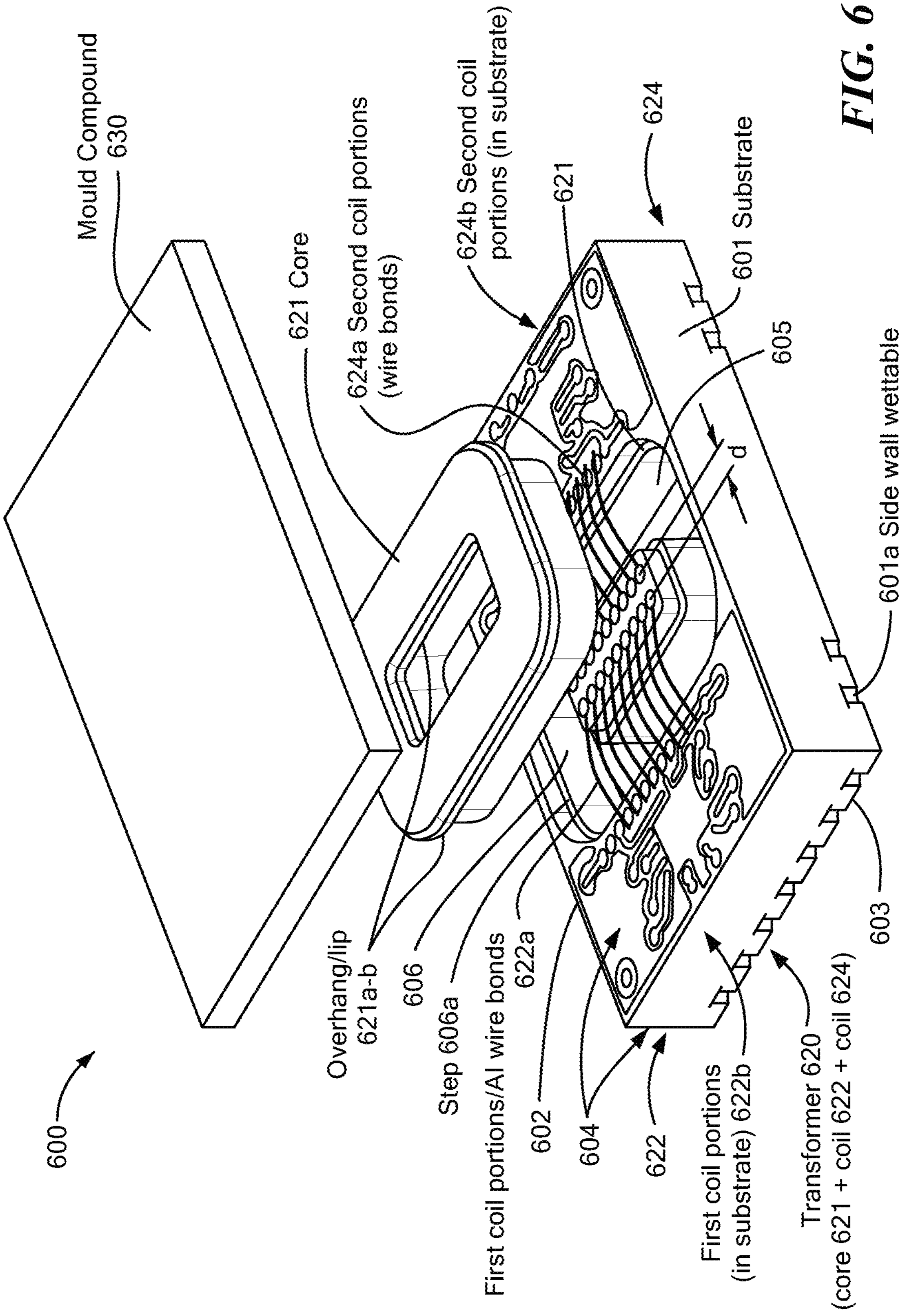
FIG. 6 shows an exploded view of another example of an isolation transformer package with included IC die, in accordance with the present disclosure.

FIG. 6 shows an exploded view of another example of an isolation transformer package 600 with included IC die, in accordance with the present disclosure. Substrate 601 is shown with sidewall (wettable) 601*a* and opposed first and second sides (surfaces) 602, 603. Substrate 601 includes a plurality of conductive structures/traces 604, which may be disposed within and/or on substrate 601. The plurality of conductive structures/traces 604 can include first and second groups that are galvanically separate. Galvanically separated primary and secondary coils 622 and 624 include first (wire) portions 622*a*, 624*a* and second (buried) portions 622*b*, 624*b* respectively. Coil portions 622*a* and 624*a* may have a designed/desired separation distance, d, as shown. Separation distance "d" may be selected as desired, e.g., to meet a given creepage requirement for a specification/rating. While core 621 is shown removed from substrate 601, core 621 would be disposed in cavity/recess 605 prior to wire portions 622*a*, 624*a* being connected. Core 621 can include overhang or lips 621*a-b*, which can be received by or disposed on step 606*a* formed in recess sidewall 606. An encapsulation layer 630 of encapsulant material can be included. Any suitable encapsulant may be used for layer 630. Suitable encapsulant materials may include, but are not limited to, one or more molding materials, potting materials, dielectric materials, and/or the like. While not shown, other components such as ID die can be connected to the primary and secondary sides of transformer 620 within package 600.

In some examples and/or embodiments, integrated circuits (ICs), e.g., in IC die 310 and 312 in FIG. 3, or other conductive features of the primary and secondary sides of a transformer structure in an IC or transformer package according to the present disclosure can be fabricated or configured to have a desired separation distance (d) between certain parts or features, e.g., to meet internal creepage or external clearance requirements for a given pollution degree rating as defined by certain safety standards bodies such as the Underwriters Laboratories (UL) and the International Electrotechnical Commission (IEC). For example, a separation distance may be between closest (voltage) points of the respective circuits, e.g., the low-voltage (primary) side and high-voltage (secondary) side. For further example, such a separation distance may be the distance between any two voltage points between the primary and secondary sides, e.g., a distance between die, or a distance between exposed leads connected to the die, may be, may be approximately, or may be at least 1.2 mm, 1.4 mm, 1.5 mm, 3.0 mm, 4.0 mm, 5.5 mm, 7.2 mm, 8.0 mm, 10 mm, or 10+mm in respective examples. Such a distance between conductive portions or areas of die can include any insulation covering a conductor, e.g., such as plastic coating of a wire/lead. Other distances between conductive parts, components, and/or features of an IC/transformer package may also be designed and implemented, e.g., to meet desired internal creepage, voltage breakdown, or external clearance requirements, e.g., between external leads.

In some examples and embodiments, a dielectric material (e.g., gel) may be used for potting and/or protecting substrate systems, assemblies, and/or packages, including magnetic/or die and/or interconnects from environment conditions and/or to provide dielectric insulation. In some examples, a dielectric material may include, but is not limited to, one or more of the following materials: DOWSIL™ EG-3810 Dielectric Gel (made available by The Dow Chemical Corporation, a.k.a., "Dow"), and DOWSIL™ EG-3896 Dielectric Gel (made available by Dow), which has the ability to provide isolation greater than 20 kV/mm. Other suitable gel materials may also or instead be used, e.g., to meet or facilitate meeting/achieving voltage isolation specifications required by a given package design. DOWSIL™ EG-3810 is designed for temperature ranges from −60° C. to 200° C. and DOWSIL™ EG-3896 Dielectric Gel −40° C. to +185° C.; both of which can be used to meet typical temperature ranges for automotive applications.

Accordingly, embodiments and/or examples of the inventive subject matter can afford various benefits relative to prior art techniques. For example, embodiments and examples of the present disclosure can enable or facilitate use of smaller size packages for a given power, current. or voltage rating. Embodiments and examples of the present disclosure can enable or facilitate lower costs and higher scalability for manufacturing of IC packages/modules having voltage-isolated (galvanic isolation) IC die and transformers.

Various embodiments and/or examples of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, which includes a list of elements is not necessarily limited to only those elements but can include other elements not expressly listed or inherent to such apparatus, method, composition, mixture, or article.

Additionally, the term "exemplary" means "serving as an example, instance, or illustration." Any embodiment or design described as "exemplary" is not necessarily to be construed as preferred or advantageous over other embodiments or designs. The terms "one or more," "plurality," and "at least one" indicate any integer number greater than or equal to one, i.e., one, two, three, four, etc. Those terms, however, may refer to fractional numbers/values greater than one where context admits, e.g., "one or more windings," "a plurality" of windings or "at least one winding" can refer to a number of windings of a coil having a fractional value such as 1.5, 2.75, 3.8, 6.6, etc. The term "connection" can include an indirect connection and a direct connection.

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases do not necessarily refer to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A transformer based integrated circuit (IC) package comprising:

a substrate including a cavity, wherein the cavity includes an aperture;

a magnetic core disposed in the cavity, wherein the magnetic core includes a soft ferromagnetic material, wherein the cavity is configured to provide a space between an interior surface of the cavity and an exterior surface of the magnetic core;

a cap disposed in the aperture and configured to seal the aperture;

a plurality of conductive traces forming first and second coils disposed about the magnetic core, wherein the first and second coils and magnetic core are configured as a transformer; and an encapsulant material configured to encapsulate a surface of the substrate, wherein the encapsulant material is configured to form a surface of a package body; and at least one semiconductor die disposed on the substrate between the substrate and the encapsulant material.

2. The IC package of claim 1, wherein the space comprises a gap between the interior surface of the cavity and the exterior surface of the magnetic core.

3. The IC package of claim 2, wherein the gap is between about 250 nm to about 2 mm.

4. The IC package of claim 1, wherein the at least one semiconductor die comprises an integrated circuit (IC).

5. The IC package of claim 4, wherein the IC comprises a gate driver.

6. The IC package of claim 5, wherein the first and second coils are configured as primary and secondary coils in a step-up configuration.

7. The IC package of claim 1, wherein the magnetic core comprises ferrite.

8. The IC package of claim 1, wherein the substrate comprises a printed circuit board (PCB).

9. The IC package of claim 1, wherein the cap comprises soft ferromagnetic material.

10. The IC package of claim 9, wherein the cap comprises ferrite.

11. The IC package of claim 1, wherein the cap comprises mold material.

12. The IC package of claim 11, wherein the cap comprises a plurality of coil portions of the first and second coils.

13. The IC package of claim 1, wherein the substrate includes a step at the aperture, wherein the step is configured to receive the cap at least partially within the substrate.

14. A method of making an integrated circuit (IC) and transformer package, the method comprising:

providing a substrate including a cavity, wherein the cavity includes an aperture;

providing a magnetic core disposed in the cavity, wherein the magnetic core includes a soft ferromagnetic material, wherein the cavity is configured to provide a space between an interior surface of the cavity and an exterior surface of the magnetic core;

providing a cap disposed in the aperture and configured to seal the aperture;

providing one or more semiconductor die on the substrate;

providing first and second coils disposed about the magnetic core, wherein the first and second coils and magnetic core are configured as a transformer; and providing a molding material encapsulating a surface of the substrate, the cap, the one or more semiconductor die, and the transformer, wherein the molding material forms a package body.

15. The method of claim 14, wherein providing the first and second coils disposed about the magnetic core comprises connecting a first plurality of coil portions disposed in the substrate with a second plurality of coil portions disposed exterior to the substrate.

16. The method of claim 15, wherein the second plurality of coil portions are provided after the cap is disposed in the aperture.

17. The method of claim 15, wherein the second plurality of coil portions comprises wire bonds.

18. The method of claim 14 wherein the substrate comprises a printed circuit board (PCB).

19. The method of claim 14, wherein the magnetic core and/or cap comprise ferrite.

20. The method of claim 14, wherein the cap comprises mold material.

21. The method of claim 20, wherein the cap comprises a plurality of coil portions of the first and second coils.

22. The method of claim 14, wherein the substrate includes a step at the aperture, wherein the step is configured to receive the cap at least partially within the substrate.

23. The method of claim 14, wherein the one or more semiconductor die comprise first and second semiconductor die comprising first and second integrated circuits (ICs), respectively, and wherein the first and second coils are connected to the first and second ICs, respectively.

24. The method of claim 23, wherein the first and second ICs are galvanically isolated.

25. The method of claim 23, wherein the second IC comprises a gate driver.

26. A voltage-isolated integrated circuit (IC) package comprising:

- a package body including molding material;
- a substrate disposed within the package body, wherein the substrate includes a cavity having an aperture;
- a magnetic core disposed in the cavity, wherein the magnetic core includes a soft ferromagnetic material;
- wherein the cavity is configured to provide a space between an interior surface of the cavity and an exterior surface of the magnetic core, and wherein the magnetic core is unconstrained by the substrate;
- a cap disposed in the aperture and configured to seal the aperture;
- a plurality of conductive traces forming first and second coils disposed about the magnetic core, wherein the first and second coils and magnetic core are configured as a transformer;
- first and second IC die disposed between the substrate and the molding material and connected to the first and second coils, respectively;
- a first plurality of leads connected to the first IC die, wherein the first plurality of leads includes exposed lead portions accessible from the exterior of the package body; and
- a second plurality of leads connected to the second IC die, wherein the second plurality of leads includes exposed lead portions accessible from the exterior of the package body.

27. The IC package of claim 26, wherein the second IC die comprises a gate driver.

28. The IC package of claim 26, wherein the transformer is configured as a step-up transformer.

29. The IC package of claim 26, wherein the magnetic core and/or cap includes ferrite.

30. The IC package of claim 26, wherein the substrate comprises a printed circuit board (PCB).

31. The IC package of claim 26, wherein the space comprises a gap between the interior surface of the cavity and the exterior surface of the magnetic core.

32. The IC package of claim 31, wherein the gap is between about 100 nm to about 2 mm.

33. The IC package of claim 26, wherein the cap comprises a mold material.

34. The IC package of claim 33, wherein the cap comprises a plurality of coil portions of the first and second coils.

35. The IC package of claim 26, wherein the substrate includes a step at the aperture, wherein the step is configured to receive the cap at least partially within the substrate.

36. The IC package of claim 26, further comprising a seal disposed between the cap and the substrate.

37. The IC package of claim 36, wherein the seal comprises epoxy.

38. The IC package of claim 1, wherein the substrate includes a step at the aperture, wherein the step is configured to receive the cap at least partially within the cavity of the substrate.

39. The method of claim 14, wherein the substrate includes a step at the aperture, wherein the step is configured to receive the cap at least partially within the cavity of the substrate.

* * * * *